(12) United States Patent
Qin

(10) Patent No.: US 10,263,202 B2
(45) Date of Patent: Apr. 16, 2019

(54) FLEXIBLE BASE PLATE OF OLED DISPLAY PANEL AND METHOD FOR MANUFACTURING THE SAME

(71) Applicant: Wuhan China Star Optoelectronics Semiconductor Display Technology Co., Ltd., Wuhan, Hubei (CN)

(72) Inventor: Xuesi Qin, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/580,236

(22) PCT Filed: Nov. 6, 2017

(86) PCT No.: PCT/CN2017/109461
§ 371 (c)(1),
(2) Date: Dec. 6, 2017

(65) Prior Publication Data
US 2019/0044079 A1    Feb. 7, 2019

(30) Foreign Application Priority Data
Aug. 4, 2017  (CN) .......................... 2017 1 0660404

(51) Int. Cl.
*H01L 51/50* (2006.01)
*H01L 51/52* (2006.01)
(Continued)

(52) U.S. Cl.
CPC ...... *H01L 51/0097* (2013.01); *H01L 27/3244* (2013.01); *H01L 51/5012* (2013.01); *H01L 51/5237* (2013.01); *H01L 51/56* (2013.01)

(58) Field of Classification Search
CPC combination set(s) only.
See application file for complete search history.

(56) References Cited

U.S. PATENT DOCUMENTS

| 2003/0164496 A1* | 9/2003 | Do ...................... H01L 51/5262 257/40 |
| 2011/0121355 A1* | 5/2011 | Bae ..................... H01L 51/5253 257/100 |

(Continued)

FOREIGN PATENT DOCUMENTS

| CN | 104867872 A | 8/2015 |
| CN | 106206945 A | 12/2016 |
| CN | 106585015 A | 4/2017 |

*Primary Examiner* — Michael Lebentritt
*Assistant Examiner* — Jordan M Klein
(74) *Attorney, Agent, or Firm* — Kirton McConkie; Evan R. Witt

(57) ABSTRACT

The present disclosure provides a method for manufacturing a flexible base plate of an OLED display panel, comprising following steps: a step S10 of providing a glass substrate; a step S20 of forming a first polyimide layer on the surface of the glass substrate; and a step S30 of forming a buffer layer on a surface of the first polyimide layer; wherein the step S30 comprises: a step S301 of forming a silicon oxide layer on a surface of the first polyimide layer; and a step S302 of using ion implantation to implant a plurality of titanium ions into the silicon oxide layer for forming a mixed layer of titanium dioxide and silicon oxide.

15 Claims, 1 Drawing Sheet

(51) Int. Cl.
*H01L 51/56* (2006.01)
*H01L 51/00* (2006.01)
*H01L 27/32* (2006.01)

(56) References Cited

U.S. PATENT DOCUMENTS

| | | | |
|---|---|---|---|
| 2013/0209800 A1* | 8/2013 | Uemura | C09J 7/29 428/354 |
| 2014/0225075 A1* | 8/2014 | Zhan | H01L 29/78672 257/40 |
| 2016/0109625 A1* | 4/2016 | Guimard | H01L 51/0097 257/40 |
| 2016/0260544 A1* | 9/2016 | Adiga | H01G 4/06 |
| 2018/0287080 A1* | 10/2018 | Wang | H01L 51/0097 |

\* cited by examiner

FLEXIBLE BASE PLATE OF OLED DISPLAY PANEL AND METHOD FOR MANUFACTURING THE SAME

FIELD OF THE DISCLOSURE

The present disclosure relates to the field of liquid crystal display, and more particularly to a gate driver on array (GOA) circuit and a liquid crystal display panel having the GOA circuit.

BACKGROUND

Organic light-emitting diode (OLED) displays, also known as organic electro-luminescent displays, are a new type of flat panel display. Because of its advantages such as simple manufacturing process, low cost, low power consumption, high luminance, wide range of operating temperature, light in weight and thin in volume, fast response, easy color display and large screen sizes, easy compatibility with drivers of integrated circuits, and easiness in forming flexible displays, OLED displays have a promising future of wide applications. Presently, light-emitting devices are used to develop flexible OLED display panels, which use flexible base plates to replace conventional glass base plates for flexibility of panels.

Flexible OLED display panels are a new development trend for the display panels. Because next generation of flexible OLED display panel uses polyimide (PI) as flexible base plate, the PI base plate has to have excellent properties, and number of defects in PI base plate has to be low in order to increase manufacturing yield of flexible OLED display panels. It is also required to reduce damages to PI base plates during manufacturing process of OLED display panels.

However, during the manufacturing process of OLED display panels, excimer laser annealing and excimer laser stripping of glass substrates results in certain degree of damage to PI base plates, even making PI base plates to form holes.

To reduce damage to PI base plates caused by the excimer laser during the manufacturing process of display panels, a buffer layer is generally formed. In such a buffer layer, SiNx prevents Al/Ba/Na ions from diffusing into PI base plates to decrease current leakage, and because SiOx has superior thermal insulation, dissipation of heat during crystallization of a-Si decreases and larger grain sizes can be formed. In addition, SiNx has good ability to isolate ions and causes lower stress when in contact with glass, and SiOx has better wetting angle with respect to polysilicon boundary. Thus, a stack of SiNx/SiOx is generally adopted. However, in the base plates of flexible OLED display panels, SiNx layer does not directly contact glass substrate, thus SiNx layer is functioned for insulation and buffer only. Thermal insulation ability of SiOx during excimer laser annealing (ELA) is still insufficient, and PI layer is easily to be damaged.

Therefore, the buffer layer of flexible base plate in conventional OLED display panels does not have remarkable effects in protecting PI layer, leading to not only easily causing damage to PI layer but further influencing quality of OLED display panels.

SUMMARY OF THE DISCLOSURE

The objective of the present disclosure is to provide a method for manufacturing a flexible base plate of an OLED display panel. The flexible base plate provided by the present disclosure includes a buffer layer which mitigates damage to the PI layer caused by the excimer laser. The present disclosure solves the problems existing in the prior art where the buffer layer of flexible base plate in conventional OLED display panels does not have remarkable effects in protecting PI layer, leading to not only easily causing damage to PI layer but further influencing quality of OLED display panels.

To solve the aforementioned problems, the present disclosure provides plural technical schemes as described below.

The present disclosure provides a method for manufacturing a flexible base plate of an OLED display panel, comprising following steps:
a step S10 of providing a glass substrate;
wherein the step S10 comprises:
a step S101 of forming a photoresist layer on a surface of the glass substrate;
a step S20 of forming a first polyimide layer on the surface of the glass substrate;
a step S30 of forming a buffer layer on a surface of the first polyimide layer;
wherein the step S30 comprises:
a step S301 of forming a silicon oxide layer on a surface of the first polyimide layer; and
a step S302 of using ion implantation to implant a plurality of titanium ions into the silicon oxide layer for forming a mixed layer of titanium dioxide and silicon oxide; and
a step S40 of forming a polysilicon layer on a surface of the buffer layer.

In accordance with a preferred embodiment of the present disclosure, in the step S302, a concentration of the titanium ions gradually decreases from one side of the silicon oxide layer distanced from the first polyimide layer to the other side of the silicon oxide layer proximate to the first polyimide layer.

In accordance with a preferred embodiment of the present disclosure, in the step S302, the concentration of the titanium ions at the other side of the silicon oxide layer proximate to the first polyimide layer is zero.

In accordance with a preferred embodiment of the present disclosure, after the step S40, the method further comprises:
a step S50 of forming a second polyimide layer on a surface of the polysilicon layer.

In accordance with a preferred embodiment of the present disclosure, after the step S50, the method further comprises:
a step S60 of stripping the glass substrate by using excimer laser.

In addition, the present disclosure provides a method for manufacturing a flexible base plate of an OLED display panel, comprising following steps:
a step S10 of providing a glass substrate;
a step S20 of forming a first polyimide layer on a surface of the glass substrate;
a step S30 of forming a buffer layer on a surface of the first polyimide layer;
wherein the step S30 comprises:
a step S301 of forming a silicon oxide layer on a surface of the first polyimide layer; and
a step S302 of using ion implantation to implant a plurality of titanium ions into the silicon oxide layer for forming a mixed layer of titanium dioxide and silicon oxide; and
a step S40 of forming a polysilicon layer on a surface of the buffer layer.

In accordance with a preferred embodiment of the present disclosure, in the step S302, a concentration of the titanium ions gradually decreases from one side of the silicon oxide layer distanced from the first polyimide layer to the other side of the silicon oxide layer proximate to the first polyimide layer.

In accordance with a preferred embodiment of the present disclosure, in the step S302, the concentration of the titanium ions at the other side of the silicon oxide layer proximate to the first polyimide layer is zero.

In accordance with a preferred embodiment of the present disclosure, after the step S40, the method further comprises:

a step S50 of forming a second polyimide layer on a surface of the polysilicon layer.

In accordance with a preferred embodiment of the present disclosure, after the step S50, the method further comprises:

a step S60 of stripping the glass substrate by using excimer laser.

Also, the present disclosure provides a flexible base plate manufactured by the above-mentioned method, the flexible base plate comprising:

the first polyimide layer;

the buffer layer formed on the surface of the first polyimide layer, wherein the buffer layer comprises:

the silicon oxide layer formed on the surface of the first polyimide layer, wherein the silicon oxide layer comprises the titanium ions implanted thereinto; and the polysilicon layer.

In accordance with a preferred embodiment of the present disclosure, a concentration of the titanium ions gradually decreases from one side of the silicon oxide layer distanced from the first polyimide layer to the other side of the silicon oxide layer proximate to the first polyimide layer.

In accordance with a preferred embodiment of the present disclosure, the concentration of the titanium ions at the other side of the silicon oxide layer proximate to the first polyimide layer is zero.

In accordance with a preferred embodiment of the present disclosure, the method further comprises a second polyimide layer formed on a surface of the polysilicon layer.

In accordance with a preferred embodiment of the present disclosure, a thickness of the buffer layer is about three times a thickness of the first polyimide layer.

Compared to flexible base plate of conventional OLED display panel, the flexible base plate of the present disclosure includes a buffer layer which increases absorption of the UV excimer laser and decreases transmittance of the UV excimer laser to mitigate damage to the PI layer caused by excimer laser annealing and raise yield of products. Accordingly, the present disclosure solves the problems existing in the prior art where the buffer layer of flexible base plate in conventional OLED display panels does not have remarkable effects in protecting PI layer, leading to not only easily causing damage to PI layer but further influencing quality of OLED display panels.

BRIEF DESCRIPTION OF THE DRAWINGS

In order to more clearly illustrate the technical schemes according to the embodiments of the present disclosure or in the prior art, the following description makes brief description for the drawings used in the embodiments of the present disclosure or in the prior art. Apparently, the following description of the drawings is only some embodiments of the invention. For those of ordinary skill in the art can also obtain other drawings based on these drawings without additional creative labor, in which.

DETAILED DESCRIPTION

Figure 1:
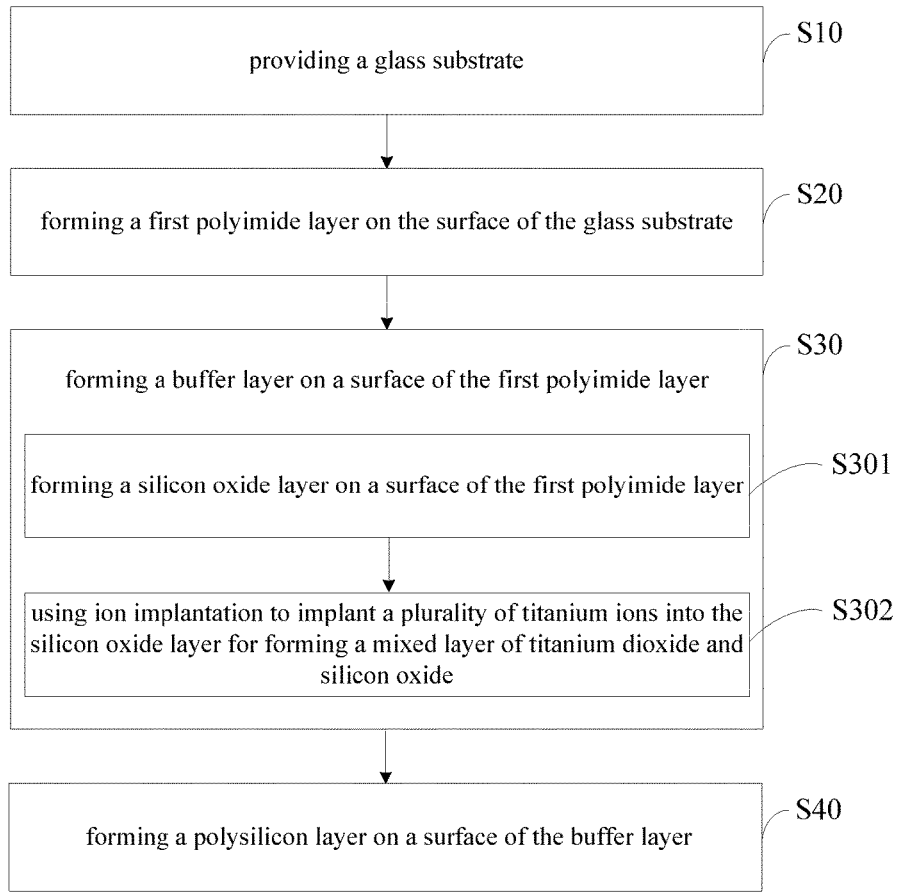
FIG. 1 is a flow chart showing steps of a method for manufacturing a flexible base plate of an OLED display panel according to an embodiment of the present disclosure.

The following description of the embodiments with reference to the appended drawings can be used to illustrate a specific embodiment of the embodiment of the invention. Direction of the present invention mentioned term, such as "upper", "lower", "front", "rear", "left", "Right", "inner", "outer", "side", etc., are merely directions referred in the drawings. Therefore, the direction of terms used is to describe and understand the present invention, and not to limit the invention. In the drawings, the same reference numerals denote similar structural elements.

The present disclosure solves the problems existing in the buffer layer of flexible base plate in conventional OLED display panels which does not have remarkable effects in protecting PI layer, leading to not only easily causing damage to PI layer but further influencing quality of OLED display panels.

As shown in FIG. 1, the method for manufacturing a flexible base plate of an OLED display panel according to the present disclosure comprises following steps:

a step S10 of providing a glass substrate;

a step S20 of forming a first polyimide layer on a surface of the glass substrate;

a step S30 of forming a buffer layer on a surface of the first polyimide layer, wherein the step S30 comprises: a step S301 of forming a silicon oxide layer on a surface of the first polyimide layer; and a step S302 of using ion implantation to implant a plurality of titanium ions into the silicon oxide layer for forming a mixed layer of titanium dioxide and silicon oxide; and a step S40 of forming a polysilicon layer on a surface of the buffer layer.

In the step S20, the first polyimide layer is highly flexible and impact-resistant, and is used as the flexible base plate and a protecting layer of the OLED display panel.

In the step S30, the buffer layer is configured to decrease transmittance of the UV excimer laser and further mitigate damage to the first polyimide layer caused by the UV excimer laser in an annealing process carried out for OLED display panel. Moreover, once the flexible base plate is manufactured, a thin film transistor (TFT) layer and an OLED luminescent layer are formed on a surface of the flexible base plate. After manufacture of OLED display panel is complete, the UV excimer laser is used to strip the glass substrate provided in the step S10. Meanwhile, the buffer layer is configured to decrease transmittance of the UV excimer laser and further prevents the UV excimer laser from transmitting through the flexible base plate to damage the TFT layer.

For example, after the step S10, the method further comprises a step S101 of forming a photoresist layer on a surface of the glass substrate, wherein the first polyimide layer is formed on a surface of the photoresist layer. At the time of using the UV excimer laser to strip the glass substrate, the photoresist layer can prevent the UV excimer laser from transmitting through the glass substrate where the UV excimer laser may cause damage to the first polyimide layer. The photoresist layer is stripped after the glass substrate is stripped.

In the step S301, a silicon oxide layer having a thicker thickness is formed on a surface of the first polyimide layer. The silicon oxide layer has excellent thermal insulation qualities, therefore dissipation of heat during crystallization of polysilicon in the step S40 is decreased and larger grain sizes can be formed.

In the step S302, ion implantation is used to implant a plurality of titanium ions into the silicon oxide layer for forming a mixed layer of titanium dioxide and silicon oxide. The grain size of titanium dioxide is controlled to be nanoscale, therefore isolation from UV light is stronger.

When using an ion implantation apparatus to implant titanium ions into the silicon oxide layer, ion beam energy is controlled to control lateral area and implanting depth of the implanted ions. By controlling ion beams, distribution of titanium ions in a lateral direction is approximate to range of silicon oxide layer, and distribution of titanium ions in longitudinal direction results in a concentration of the titanium ions gradually decreases from one side of the silicon oxide layer distanced from the first polyimide layer to the other side of the silicon oxide layer proximate to the first polyimide layer in order to avoid the silicon oxide layer from electrically conducting.

The concentration of the titanium ions at the other side of the silicon oxide layer proximate to the first polyimide layer is zero. The silicon oxide layer includes a non-implantation area which is located silicon oxide layer at a location near the first polyimide layer. There are no titanium ions implanted into the non-implantation area. The non-implantation area is used as an isolation area to prevent titanium dioxide from influencing insulation effect of the silicon oxide layer.

In the step S40, the polysilicon layer is formed on the surface of the buffer layer. The polysilicon layer can be replaced with an amorphous silicon layer.

After the step S40, the method further comprises a step S50 of forming a second polyimide layer on a surface of the polysilicon layer. The second polyimide layer and the first polyimide layer are both used as protecting layers to protect the flexible base plate. The polysilicon layer in the step S40 is used as a bonding layer between the second polyimide layer and the buffer layer.

After the step S50, the method further comprises a step S60 of stripping the glass substrate using the excimer laser, so that a flexible base plate which is bendable is thus produced. After the step S50 and before the step S60, the method further comprises: a step S501 of forming a TFT layer on the second polyimide layer; and a step S502 of forming an OLED luminescent layer on the TFT layer.

Figure 2:
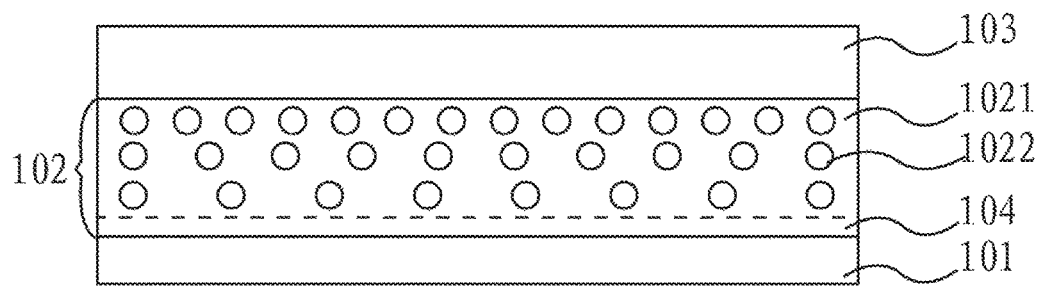
FIG. 2 is a schematic diagram showing a structure of a flexible base plate manufactured according to the method of the present disclosure.

According to the above objective of the present disclosure, the present disclosure also provides a flexible base plate (as shown in FIG. 2) manufactured by the above-mentioned method, the flexible base plate comprising: the first polyimide layer 101; the buffer layer 102 formed on the surface of the first polyimide layer 101, wherein the buffer layer 102 comprises: the silicon oxide layer 1021 formed on the surface of the first polyimide layer 101, wherein the silicon oxide layer 1021 comprises the titanium ions 1022 implanted thereinto; and the polysilicon layer 103 formed on the surface of the buffer layer 102.

In accordance with a preferred embodiment of the present disclosure, a concentration of the titanium ions 1022 gradually decreases from one side of the silicon oxide layer 1021 distanced from the first polyimide layer 101 to the other side of the silicon oxide layer 1021 proximate to the first polyimide layer 101.

In accordance with a preferred embodiment of the present disclosure, the concentration of the titanium ions 1022 at the other side of the silicon oxide layer 1021 proximate to the first polyimide layer 101 is zero. The silicon oxide layer 1021 includes a non-implantation area 104 which is located in the silicon oxide layer 1021 at a location near the first polyimide layer 101. There is no titanium ions 1022 implanted into the non-implantation area 104. The non-implantation area 104 is used as an isolation area to prevent titanium dioxide from influencing insulation effect of the silicon oxide layer 1021.

In accordance with a preferred embodiment of the present disclosure, the flexible base plate further comprises a second polyimide layer formed on the surface of the polysilicon layer 103.

In accordance with a preferred embodiment of the present disclosure, a thickness of the buffer layer 102 is about three times a thickness of the first polyimide layer 101.

The flexible base plate of the present embodiment is manufactured by the method for manufacturing the flexible base plate of OLED display panel described in the above embodiment. The manufacturing process of the flexible base plate of the present embodiment is basically the same as the manufacturing method described in the above embodiment, and thus is omitted for avoiding redundancy.

Compared to flexible base plate of conventional OLED display panel, the flexible base plate of the present disclosure includes a buffer layer which increases absorption of the UV excimer laser and decreases transmittance of the UV excimer laser to mitigate damage to the PI layer caused by excimer laser annealing and raise yield of products. Accordingly, the present disclosure solves the problems existing in the prior art where the buffer layer of flexible base plate in conventional OLED display panels does not have remarkable effects in protecting PI layer, leading to not only easily causing damage to PI layer but further influencing quality of OLED display panels.

In summary, while the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing a flexible base plate of an organic light-emitting diode (OLED) display panel, comprising following steps:
   a step S10 of providing a glass substrate;
     wherein the step S10 comprises:
     a step S101 of forming a photoresist layer on a surface of the glass substrate;
   a step S20 of forming a first polyimide layer on the surface of the glass substrate;
   a step S30 of forming a buffer layer on a surface of the first polyimide layer;
     wherein the step S30 comprises:
     a step S301 of forming a silicon oxide layer on a surface of the first polyimide layer; and
     a step S302 of using ion implantation to implant a plurality of titanium ions into the silicon oxide layer for forming a mixed layer of titanium dioxide and silicon oxide; and a step S40 of forming a polysilicon layer on a surface of the buffer layer.

2. The method for manufacturing the flexible base plate according to claim 1, wherein in the step S302, a concentration of the titanium ions gradually decreases from one side of the silicon oxide layer distanced from the first polyimide layer to the other side of the silicon oxide layer proximate to the first polyimide layer.

3. The method for manufacturing a flexible base plate according to claim 2, wherein in the step S302, the concentration of the titanium ions at the other side of the silicon oxide layer proximate to the first polyimide layer is zero.

4. The method for manufacturing a flexible base plate according to claim 1, wherein after the step S40, the method further comprises:
a step S50 of forming a second polyimide layer on a surface of the polysilicon layer.

5. The method for manufacturing a flexible base plate according to claim 4, wherein after the step S50, the method further comprises:
a step S60 of stripping the glass substrate by using excimer laser.

6. A method for manufacturing a flexible base plate of an organic light-emitting diode (OLED) display panel, comprising following steps:
a step S10 of providing a glass substrate;
a step S20 of forming a first polyimide layer on a surface of the glass substrate;
a step S30 of forming a buffer layer on a surface of the first polyimide layer;
wherein the step S30 comprises:
a step S301 of forming a silicon oxide layer on a surface of the first polyimide layer; and
a step S302 of using ion implantation to implant a plurality of titanium ions into the silicon oxide layer for forming a mixed layer of titanium dioxide and silicon oxide; and
a step S40 of forming a polysilicon layer on a surface of the buffer layer.

7. The method for manufacturing a flexible base plate according to claim 6, wherein in the step S302, a concentration of the titanium ions gradually decreases from one side of the silicon oxide layer distanced from the first polyimide layer to the other side of the silicon oxide layer proximate to the first polyimide layer.

8. The method for manufacturing a flexible base plate according to claim 7, wherein in the step S302, the concentration of the titanium ions at the other side of the silicon oxide layer proximate to the first polyimide layer is zero.

9. The method for manufacturing a flexible base plate according to claim 6, wherein after the step S40, the method further comprises:
a step S50 of forming a second polyimide layer on a surface of the polysilicon layer.

10. The method for manufacturing a flexible base plate according to claim 9, wherein after the step S50, the method further comprises:
a step S60 of stripping the glass substrate by using excimer laser.

11. A flexible base plate manufactured by the method according to claim 6, the flexible base plate comprising:
the first polyimide layer;
the buffer layer formed on the surface of the first polyimide layer, wherein the buffer layer comprises:
the silicon oxide layer formed on the surface of the first polyimide layer, wherein
the silicon oxide layer comprises the titanium ions implanted thereinto; and
the polysilicon layer.

12. The flexible base plate according to claim 11, wherein a concentration of the titanium ions gradually decreases from one side of the silicon oxide layer distanced from the first polyimide layer to the other side of the silicon oxide layer proximate to the first polyimide layer.

13. The flexible base plate according to claim 12, wherein the concentration of the titanium ions at the other side of the silicon oxide layer proximate to the first polyimide layer is zero.

14. The flexible base plate according to claim 11, further comprising a second polyimide layer formed on a surface of the polysilicon layer.

15. The flexible base plate according to claim 11, wherein a thickness of the buffer layer is about three times a thickness of the first polyimide layer.

* * * * *